US012765380B2

(12) United States Patent
Chan et al.

(10) Patent No.: US 12,765,380 B2
(45) Date of Patent: Oct. 13, 2026

(54) REMOTE HEAT SINK SIDE ATTACH METHODOLOGY

(71) Applicant: Cisco Technology, Inc., San Jose, CA (US)

(72) Inventors: Gary K. Chan, Palo Alto, CA (US); Umeshbabu Nandanan, Manteca, CA (US); Phillip S. Ting, San Jose, CA (US); Mandy H. Lam, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 356 days.

(21) Appl. No.: 18/504,054

(22) Filed: Nov. 7, 2023

(65) Prior Publication Data

US 2024/0387320 A1 Nov. 21, 2024

Related U.S. Application Data

(60) Provisional application No. 63/502,356, filed on May 15, 2023.

(51) Int. Cl.

| | |
|---|---|
| ***H01L 23/00*** | (2006.01) |
| ***H01L 23/40*** | (2006.01) |
| ***H01L 23/427*** | (2006.01) |
| ***H05K 7/20*** | (2006.01) |
| ***H10W 40/60*** | (2026.01) |
| ***H10W 40/73*** | (2026.01) |
| *H10W 72/00* | (2026.01) |

(Continued)

(52) U.S. Cl.

CPC .............. *H10W 40/73* (2026.01); *H05K 7/20* (2013.01); *H10W 40/611* (2026.01); *H10W 40/60* (2026.01); *H10W 40/625* (2026.01); *H10W 72/00* (2026.01); *H10W 72/07332* (2026.01); *H10W 90/731* (2026.01); *H10W 99/00* (2026.01)

(58) Field of Classification Search

CPC . H10W 40/73; H10W 40/611; H10W 40/625; H10W 40/60; H10W 72/00; H10W 72/07332; H10W 90/731; H10W 99/00; H05K 7/20

USPC .......................................................... 361/704

See application file for complete search history.

(56) References Cited

U.S. PATENT DOCUMENTS 5,339,214 A * 8/1994 Nelson ...................... G06F 1/20 174/15.2
6,226,178 B1 * 5/2001 Broder .................... G06F 1/203 361/679.52

(Continued)

*Primary Examiner* — Anatoly Vortman

(74) *Attorney, Agent, or Firm* — Patterson + Sheridan, LLP

(57) ABSTRACT

An apparatus includes a base, an integrated circuit (IC), a thermal interface material (TIM) disposed on the IC, and a heat sink. The heat sink has a vapor chamber (VC) and a condenser coupled with, and spaced from, the VC. The condenser also has a mounting arm extending outward to a side of the condenser. The apparatus further includes a mounting bracket that couples the condenser with the base. The mounting bracket defines one or more oblong holes to accommodate respective horizontally-oriented fasteners that secure the mounting arm to the mounting bracket in such a way that the condenser is oriented and positioned at a height that enables the VC to be arranged on the TIM in a neutral position. A method of assembling such an apparatus is also disclosed.

20 Claims, 9 Drawing Sheets

(51) Int. Cl.
*H10W 90/00* (2026.01)
*H10W 99/00* (2026.01)

(56) References Cited

U.S. PATENT DOCUMENTS

| | | | | |
|---|---|---|---|---|
| 6,661,660 | B2 * | 12/2003 | Prasher | H10W 40/73<br>174/16.3 |
| 6,798,661 | B1 * | 9/2004 | Barsun | H10W 40/43<br>174/15.2 |
| 7,012,807 | B2 * | 3/2006 | Chu | G06F 1/20<br>165/80.4 |
| 7,277,282 | B2 * | 10/2007 | Tate | H10W 40/73<br>257/713 |
| 7,489,510 | B1 | 2/2009 | Hung et al. | |
| 7,542,293 | B2 * | 6/2009 | Zhao | H10W 40/73<br>361/709 |
| 7,911,781 | B2 * | 3/2011 | Chao | G06F 1/203<br>361/679.48 |
| 8,493,737 | B2 * | 7/2013 | Abe | H10W 40/73<br>361/679.52 |
| 8,804,336 | B2 * | 8/2014 | Lee | H10W 40/73<br>361/679.52 |
| 8,934,235 | B2 * | 1/2015 | Rubenstein | G06F 1/206<br>361/679.48 |
| 11,078,927 | B2 * | 8/2021 | Watanabe | H05K 7/20172 |
| 11,596,086 | B2 * | 2/2023 | Artman | H05K 7/20318 |
| 2002/0080584 | A1 * | 6/2002 | Prasher | H10W 40/73<br>257/E23.088 |
| 2004/0001316 | A1 * | 1/2004 | Kamikawa | H10W 40/73<br>361/699 |
| 2004/0027807 | A1 | 2/2004 | Kashiwagi | |
| 2004/0123978 | A1 * | 7/2004 | Hashimoto | F04D 29/582<br>257/E23.099 |
| 2004/0233639 | A1 * | 11/2004 | Upadhya | H10W 40/10<br>165/76 |
| 2008/0257527 | A1 | 10/2008 | Li et al. | |
| 2010/0314093 | A1 | 12/2010 | Refai-Ahmed et al. | |
| 2013/0000871 | A1 * | 1/2013 | Olson | H05K 7/20336<br>713/300 |
| 2020/0042053 | A1 | 2/2020 | Cheng et al. | |

* cited by examiner

REMOTE HEAT SINK SIDE ATTACH METHODOLOGY

CROSS-REFERENCE TO RELATED APPLICATIONS

This application claims benefit of U.S. provisional patent application Ser. No. 63/502,356 filed May 15, 2023. The aforementioned related patent application is herein incorporated by reference in its entirety.

TECHNICAL FIELD

Embodiments presented in this disclosure generally relate to networking devices. More specifically, embodiments disclosed herein relate to thermal management of networking devices.

BACKGROUND

One and two rack unit switches/routers often deploy high power Network Processing Unit (NPU) application specific integrated circuits (ASICs) cooled by remote heat sinks. NPUs cooled by remote heat sinks tend to run away thermally, causing low production yield. Traditional ways of securing a remote heat sink with a vertical attachment method often does not place a condenser of the heat sink at an accurate position needed to cool the NPU adequately.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
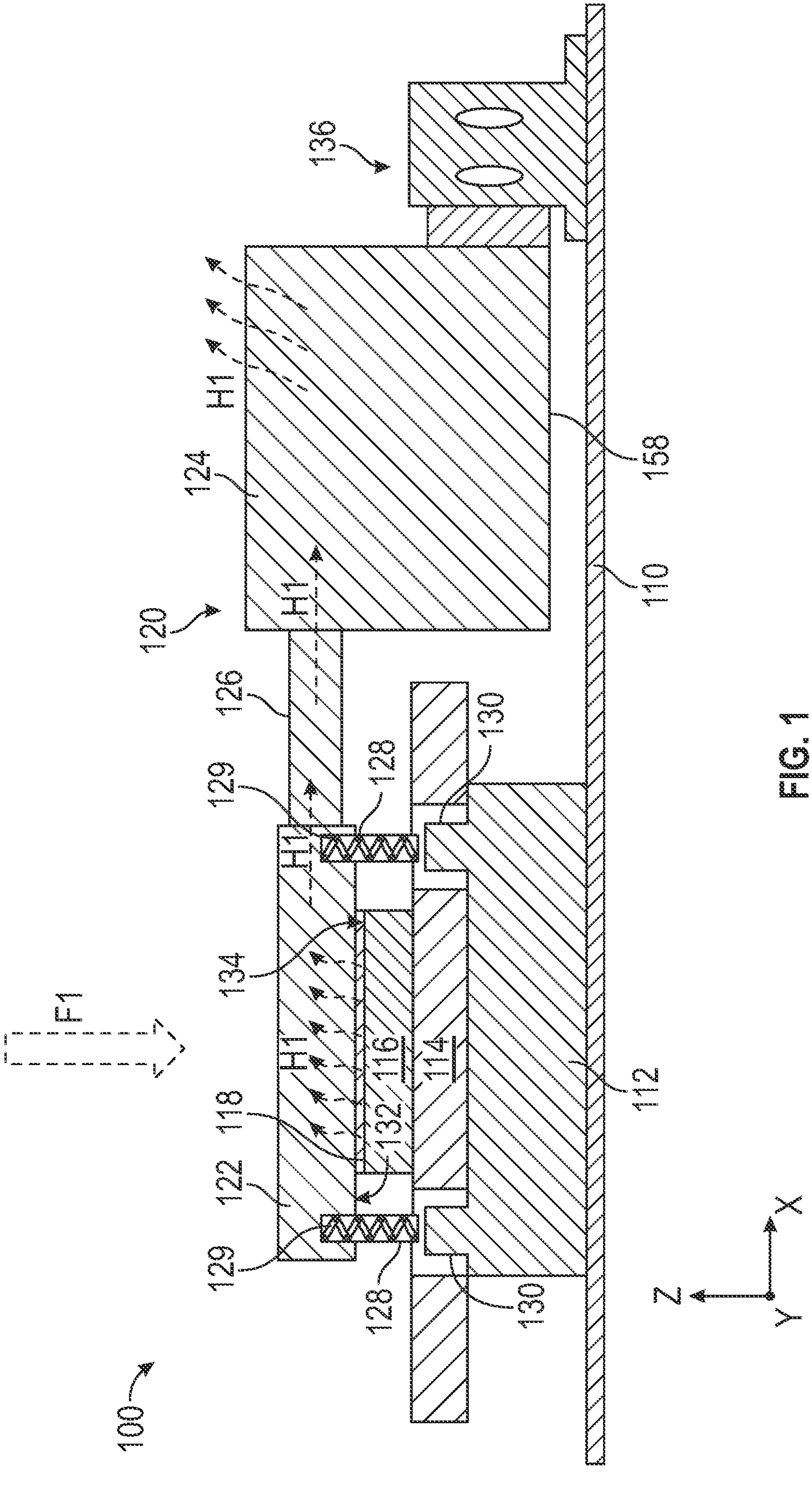
FIG. 1 is a schematic cross-sectional view of an apparatus according to example embodiments of the present disclosure.

One embodiment presented in this disclosure is an apparatus. The apparatus includes a base, an integrated circuit (IC), a thermal interface material (TIM) disposed on the IC, and a heat sink having a vapor chamber (VC) and a condenser coupled with, and spaced from, the VC. The condenser has a mounting arm extending from a side of the condenser. The apparatus also includes a mounting bracket coupling the condenser with the base. The mounting bracket defines one or more oblong holes to accommodate respective ones of one or more horizontally-oriented fasteners that secure the mounting arm to the mounting bracket in such a way that the condenser is oriented and positioned at a height so that the VC is arranged on the TIM in a neutral position.

Another embodiment presented in this disclosure is a method. The method includes applying a force on a vapor chamber (VC) so that the VC is pressed against a thermal interface material (TIM) disposed on an integrated circuit (IC), the VC is coupled with, and spaced from, a condenser. The method further includes, with the force still applied on the VC, securing the VC so that the VC is in a neutral position with respect to the TIM. The method also includes coupling the condenser with a base via a mounting bracket, which includes: arranging the mounting bracket relative to a mounting arm of the condenser; securing the mounting bracket to the base with the mounting bracket arranged relative to the mounting arm; and securing the mounting bracket to the mounting arm via one or more horizontally-oriented fasteners.

Yet another embodiment presented in this disclosure is an apparatus. The apparatus includes a base, an integrated circuit (IC), a thermal interface material (TIM) disposed on the IC, and a heat sink having a vapor chamber (VC) and a condenser coupled with, and spaced from, the VC. The condenser has a mounting arm extending from a side of the condenser. Further, the apparatus includes a mounting bracket coupling the condenser with the base. The mounting bracket has a horizontally-oriented plate and a vertically-oriented plate that each define one or more oblong holes. The horizontally-oriented plate is secured to the base via one or more vertically-oriented fasteners that extend through respective ones of the one or more oblong holes of the horizontally-oriented plate. The vertically-oriented plate is secured to the mounting arm via one or more horizontally-oriented fasteners that extend through respective ones of the one or more oblong holes of the vertically-oriented plate so that the condenser is oriented and positioned at a height that holds the VC on the TIM in a neutral position.

Example Embodiments

Apparatuses, such as switches and routers, can have chassis height limitations. Consequently, the electronics of such apparatuses can be thermally managed by a remote heat sink. Particularly, a remote heat sink can cool an integrated circuit, such as a Network Processing Unit (NPU) application specific integrated circuit (ASIC). Traditional ways of securing a remote heat sink (e.g., via a vertical attachment method) often does not place a condenser of the heat sink at an accurate position needed to cool the NPU adequately. Indeed, such traditional mounting methods can cause the condenser to be positioned at an undesirable height and/or orientation, which causes a vapor chamber of the heat sink to become cantilevered or tilted with respect to the NPU. This can result in thermal run away and low production yield, among other drawbacks.

An apparatus that addresses these challenges is disclosed herein. Specifically, an apparatus is disclosed that includes a side mounting assembly that can resolve mechanical tolerances, prevent thermal run away, and/or improve production yield, among other non-limiting benefits, advantages, and technical effects. In one example aspect, an apparatus can include a base, an integrated circuit (IC), a thermal interface material (TIM) disposed on the IC, and a heat sink having a vapor chamber (VC) and a condenser coupled with, and spaced from, the VC. The apparatus can also include a side mounting assembly having one or more side mounts. Each side mount can include a mounting arm, a mounting bracket, and a plurality of fasteners, including one or more horizontally-oriented fasteners and one or more vertically-oriented fasteners. The mounting arm of a side mount can be a part of the condenser and can extend outward to a side of the condenser. The mounting bracket of a side mount can couple the condenser with the base.

More particularly, the mounting arm of the condenser can be coupled with the mounting bracket, which in turn can be coupled with the base. The vertically-oriented fasteners can be used to couple the mounting bracket with the base. The mounting bracket can define one or more oblong holes to accommodate respective horizontally-oriented fasteners that secure the mounting bracket to the mounting arm in such a way that the condenser is oriented and positioned at a height that enables the VC to be arranged on the TIM in a neutral position. The oblong holes accommodate the mechanical tolerances of the apparatus, allowing the condenser to be secured at a height and orientation that facilitates coplanar, even surface-to-surface contact of the VC and TIM. Even pressure on the TIM results in relatively low TIM thermal resistance and ensures the NPU is cooled properly. Essentially, the oblong holes allow the condenser to "float" to the precise height and orientation before being secured with the horizontally-oriented fasteners. Moreover, as the mounting arm of the condenser is secured to the mounting bracket with horizontally-oriented fasteners, the height and orientation of the condenser can be unaffected or affected with negligible effect when the horizontally-oriented fasteners are tightened, unlike in traditional vertical attachment methods. Accordingly, such a side mounting assembly can provide certain non-limiting advantages, benefits, and/or technical effects, such as preventing NPU thermal run away, cooler NPU temperature for improved reliability, easy and rapid installation, higher yields on the production floor, and higher quality apparatuses.

In another example aspect of the present disclosure, a method of assembling an apparatus is disclosed. The method includes applying a force (e.g., via a plunger) on a VC so that the VC is pressed against a TIM disposed on an IC. The VC is coupled with, and spaced from, a condenser. The force can be applied in a downward direction on a center of the VC, for example. The method also includes, with the force still applied on the VC, securing the VC so that the VC is in a neutral position with respect to the TIM. At such time, the condenser is not yet secured, but a support can be used to support the weight of the condenser. The method can also include coupling the condenser with a base via a mounting bracket, which includes: arranging the mounting bracket relative to a mounting arm of the condenser; securing the mounting bracket to the base with the mounting bracket arranged relative to the mounting arm; and securing the mounting bracket to the mounting arm via one or more horizontally-oriented fasteners. The horizontally-oriented fasteners can extend through oblong holes of the mounting bracket, which accommodate mechanical tolerances, to secure the mounting arm and mounting bracket to one another, which secures the condenser to the correct position and orientation in all three translational axes. Once the condenser is coupled with the base via the mounting bracket, the force applied on the VC can be removed or cease to be applied. Such a method can provide certain non-limiting advantages, benefits, and technical effects, including providing a relatively easy and repeatable assembly process and yields high quality parts.

As used herein, a "horizontally-oriented fastener" is a fastener that, when assembled or in the process of being assembled, extends from head to shank end substantially along a direction orthogonal to the vertical direction, e.g., at or within 30 degrees of a direction orthogonal to the vertical direction. Further, as used herein, a "vertically-oriented fastener" is a fastener that, when assembled or in the process of being assembled, extends from head to shank end substantially along a vertical direction, e.g., at or within 30 degrees of a direction orthogonal to the vertical direction.

Referring now to the drawings, FIG. 1 is a schematic cross-sectional view of an apparatus 100 according to example embodiments of the present disclosure. The apparatus 100 can be a one Rack Unit (1RU) or two Rack Unit (2RU) switch/router, for example. For reference, the apparatus 100 defines a lateral direction X, a longitudinal direction Y, and a vertical direction Z. The lateral direction X, longitudinal direction Y, and the vertical direction Z are mutually perpendicular to one another and form an orthogonal direction system.

The apparatus 100 includes a base 110, a backing plate 112, a Printed Circuit Board (PCB), or PCB 114, and an integrated circuit (IC), or IC 116. The backing plate 112 is mounted to the base 110, or carrier base tray. The PCB 114, or motherboard, is disposed on the backing plate 112, and the IC 116 is disposed on the PCB 114. The IC 116 can be a Network Processing Unit (NPU), or more specifically, an Application-Specific Integrated Circuit (ASIC), for example. The IC 116 can be lidded or a bare die package. A Thermal Interface Material (TIM), or TIM 118, is disposed on the IC 116. As one example, the TIM 118 can be TIM2. The TIM 118 functions to dissipate and improve the transfer of heat away from the electronics of the apparatus 100, including specifically the IC 116.

Further, the apparatus 100 includes a heat sink 120, which is a remote heat sink in the depicted embodiment of FIG. 1. The heat sink 120 can be positioned remotely from the electronics of the apparatus 100, e.g., due to height restrictions of the chassis of the apparatus 100. The heat sink 120 has a vapor chamber (VC), or VC 122, and a condenser 124 coupled with, and spaced from, the VC 122. The VC 122 can also be referred to as a cold plate. The condenser 124 can be a fin stack condenser, for example; however, other types of condensers are contemplated. A heat pipe 126 extends between and couples the condenser 124 with the VC 122. The heat pipe 126 can include a single pipe or a plurality of pipes.

As illustrated in FIG. 1, the VC 122 can be mounted to the backing plate 112. A plurality of VC fasteners 128 (two of which are shown in FIG. 1) can secure the VC 122 (and the PCB 114) to the backing plate 112. The VC fasteners 128 can extend through the PCB 114 and can be received by respective backing plate standoffs 130 or threaded bosses.

With the VC 122 mounted to the backing plate 112, the VC 122 is arranged on the TIM 118. Particularly, the VC 122 is seated on or in surface-to-surface engagement with the TIM 118. In this regard, a VC mating surface 132 is in contact with a TIM mating surface 134. VC springs 129 can push the VC 122 vertically downward onto the TIM 118. During operation, heat H1 generated at the IC 116 can conduct to the TIM 118. The heat H1 can then be transferred from the TIM 118 to the VC 122. Next, the heat H1 can be directed to the condenser 124 via the heat pipe 126. The condenser 124 can expel the heat H1 remotely from the electronics.

Generally, accurate surface-to-surface alignment (or co-planarity) of the TIM 118 to the VC 122 is desirable as misalignment results in thermal run away. Once thermal run away starts, it often cannot be stopped and results in overheating and shutdown of the IC 116, which is undesirable. The height and orientation of the condenser 124 can affect the alignment or co-planarity of the VC mating surface 132 to the TIM mating surface 134. For instance, if a condenser height is high, the condenser exerts a moment on the VC and tips the VC forward, which is known as forward cantilever. This results in low pressure or force on the side of the IC closest to the condenser where TIM Boundary Layer Thickness (BLT) is high, which can result in air gaps between the VC and TIM. If the condenser height is low, the VC is tipped backward, which is known as reverse cantilever, resulting in low pressure or force on the side of the IC furthest from the condenser where the TIM BLT is also thick, which can result in air gaps between the VC and TIM. Forward and reverse cantilever tilting can increase the thermal resistance of the TIM, resulting in thermal run away of the IC.

Accordingly, mounting the condenser 124 to a precise height and orientation is desirable. In accordance with inventive aspects of the present disclosure, a side mount assembly 136 (represented schematically in FIG. 1) is disclosed herein that enables the VC 122 to be arranged on the TIM 118 in a neutral position (e.g., sitting flat). In the neutral position, the VC 122 can be free of any moment exerted by the condenser 124 and pressure applied on the TIM 118 by the VC 122 can be evenly distributed over the surface-to-surface contact area. Stated differently, the VC 122 can be arranged on the TIM 118 in a non-tilted position.

Figure 2:
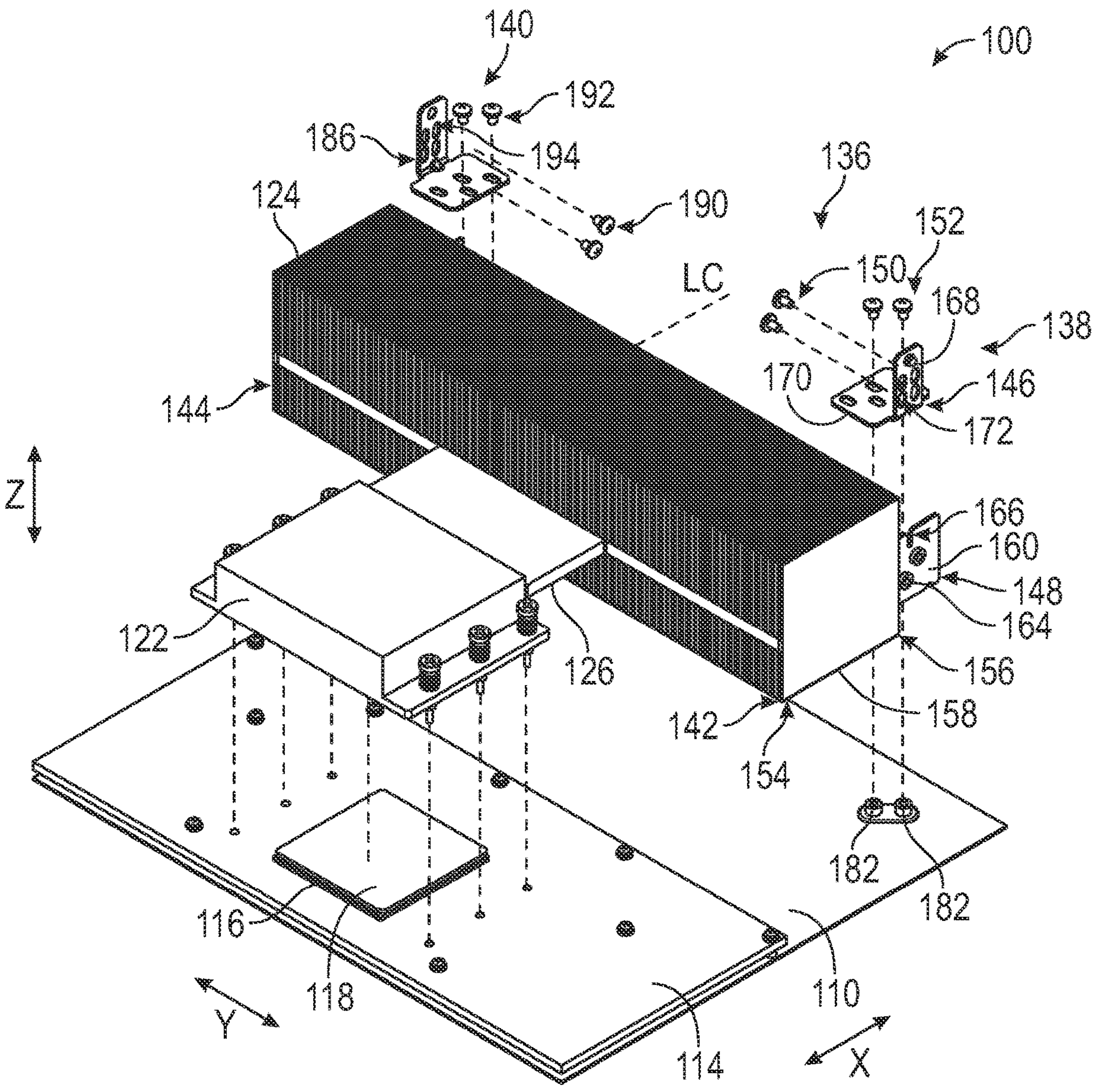
FIG. 2 is an exploded perspective view of the apparatus of FIG. 1.
Figure 3:
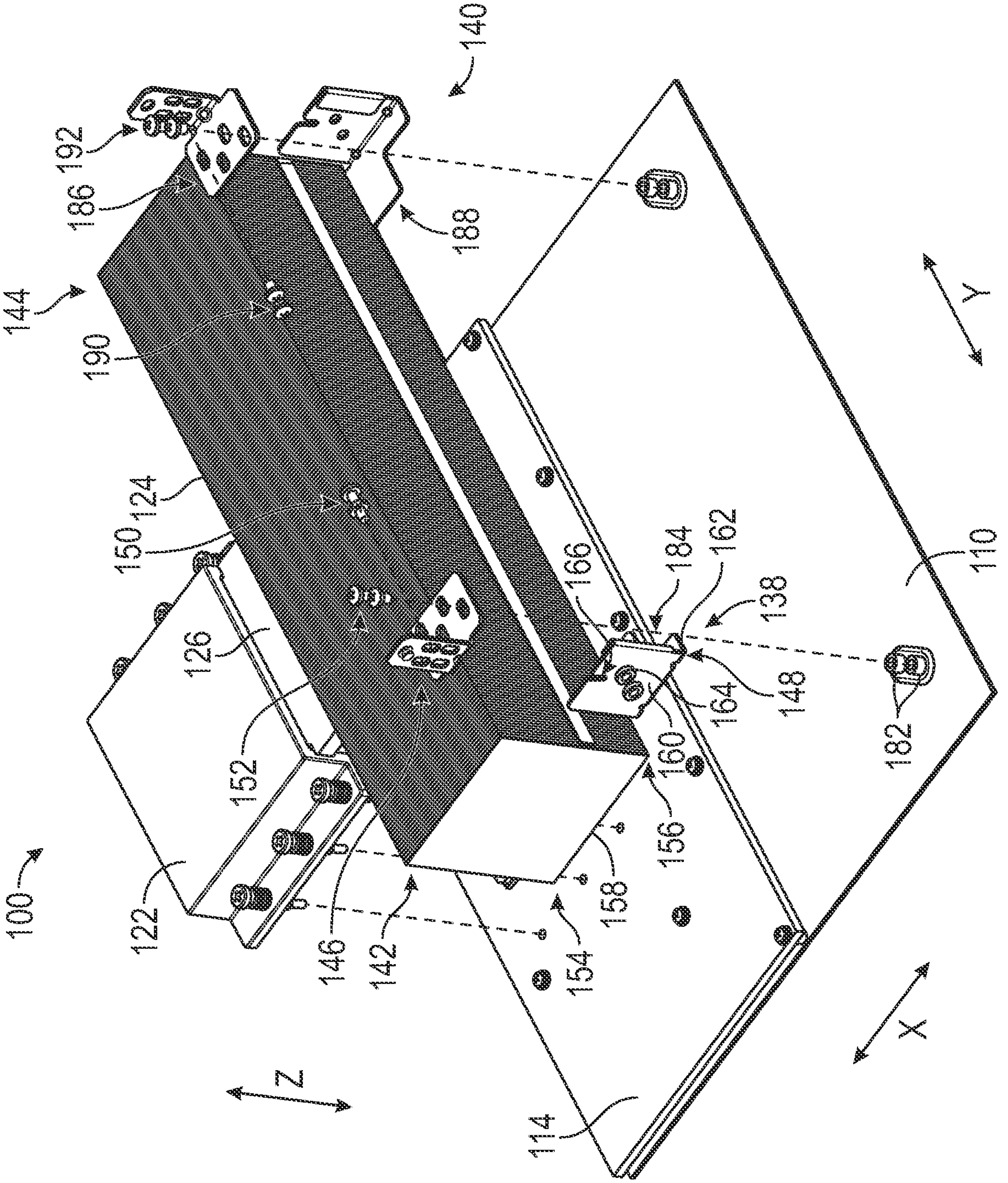
FIG. 3 is another exploded perspective view of the apparatus of FIG. 1.

With reference now to FIGS. 2 and 3, exploded perspective views of the apparatus of FIG. 1 are provided that depict the side mount assembly 136. The side mount assembly 136 includes at least one side mount. For the example embodiment of FIGS. 2 and 3, the side mount assembly 136 includes a first side mount 138 and a second side mount 140. The condenser 124 extends along a longitudinal direction Y between a first end 142 and a second end 144. The first side mount 138 is positioned at the first end 142 while the second side mount 140 is positioned at the second end 144. However, in alternative embodiments, the side mount assembly 136 can include a single side mount or more than two side mounts, such as a single side mount aligned along a longitudinal centerline LC of the condenser 124.

Each side mount generally includes a mounting bracket, a mounting arm of the condenser 124, and a plurality of fasteners (e.g., bolts, screws, etc.). For instance, the first side mount 138 includes a first mounting bracket 146, a first mounting arm 148 of the condenser 124, and a first plurality of fasteners, including at least one horizontally-oriented fastener 150 and at least one vertically-oriented fastener 152. Generally, the first mounting bracket 146 couples the condenser 124 to the base 110. Specifically, the first mounting arm 148, which extends outward to a side of the condenser 124, is secured to the first mounting bracket 146. The first mounting bracket 146 is in turn secured to the base 110. More specifically still, the condenser 124 has a proximal side 154 and a remote side 156 that is further away from the IC 116 than the proximal side 154 (e.g., along the lateral direction X). The first mounting arm 148 extends from a condenser base 158 and couples to the first mounting bracket 146, which is in turn coupled with the base 110 on the remote side 156 of the condenser 124. The first mounting arm 148 can be coupled with the condenser base 158 or can be integrally formed therewith. The various components of the first side mount 138 and the second side mount 140 will be described further below.

Figure 6:
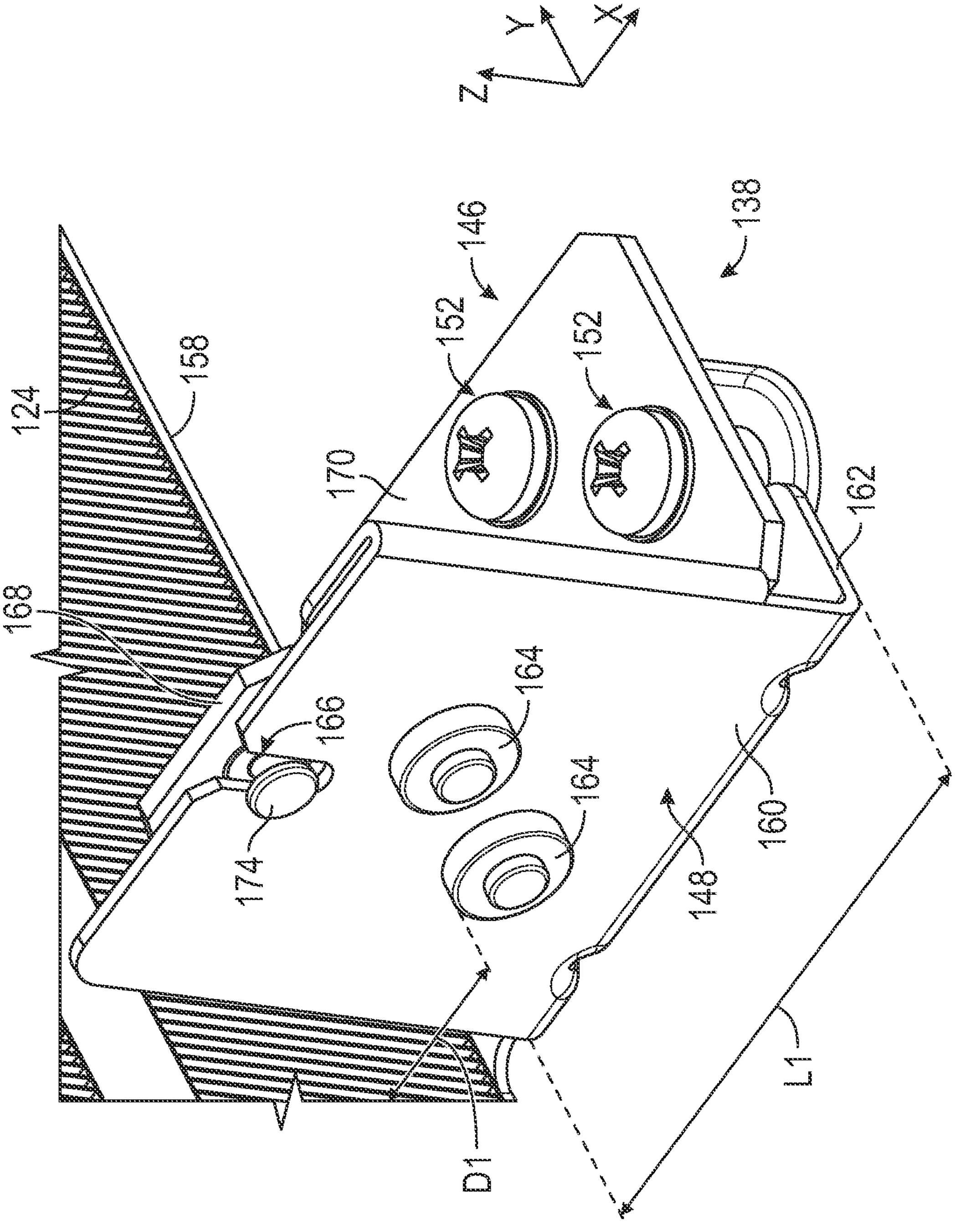
FIG. 6 is a close up, perspective view of the mounting bracket secured to a mounting arm of a condenser of the apparatus.

The first mounting arm 148 of the condenser 124 includes a vertically-oriented flange 160 and a horizontally-oriented flange 162. The first mounting arm 148 has an L-shaped cross section as viewed along the lateral direction X. The vertically-oriented flange 160 extends in a plane orthogonal to the longitudinal direction Y and has one or more threaded standoffs 164 that can receive respective horizontally-oriented fasteners 150, as will be explained further below. In addition, the threaded standoffs 164 can be spaced from a side (e.g., the remote side) of the condenser 124 to allow space for a machine or user to tighten the horizontally-oriented fasteners 150 to secure the first mounting bracket 146 to the first mounting arm 148. As one example, as shown in FIG. 6, each one of the threaded standoffs 164 can be spaced from the remote side of the condenser 124 a distance D1 that is at least one third (⅓) of a length L1 of the vertically-oriented flange 160 of the first mounting arm 148. The length L1 is a lateral length of the vertically-oriented flange 160.

Moreover, the vertically-oriented flange 160 defines a slot 166 having a long axis extending along the vertical direction Z. That is, the slot 166 has a length extending along the vertical direction Z and a width extending along the lateral direction X, and wherein the length of the slot 166 is greater than the width of the slot 166. The slot 166 can slidably receive a guide pin of the first mounting bracket 146, as will be explained further below. The horizontally-oriented flange 162 extends in a plane orthogonal to the vertical direction Z and has an L-shaped cross section as viewed along the vertical direction Z. The horizontally-oriented flange 162 functions as a seat for the first mounting bracket 146. Accordingly, when the first side mount 138 is assembled, the first mounting bracket 146 can be seated, at least in part, on the horizontally-oriented flange 162.

Figure 4:
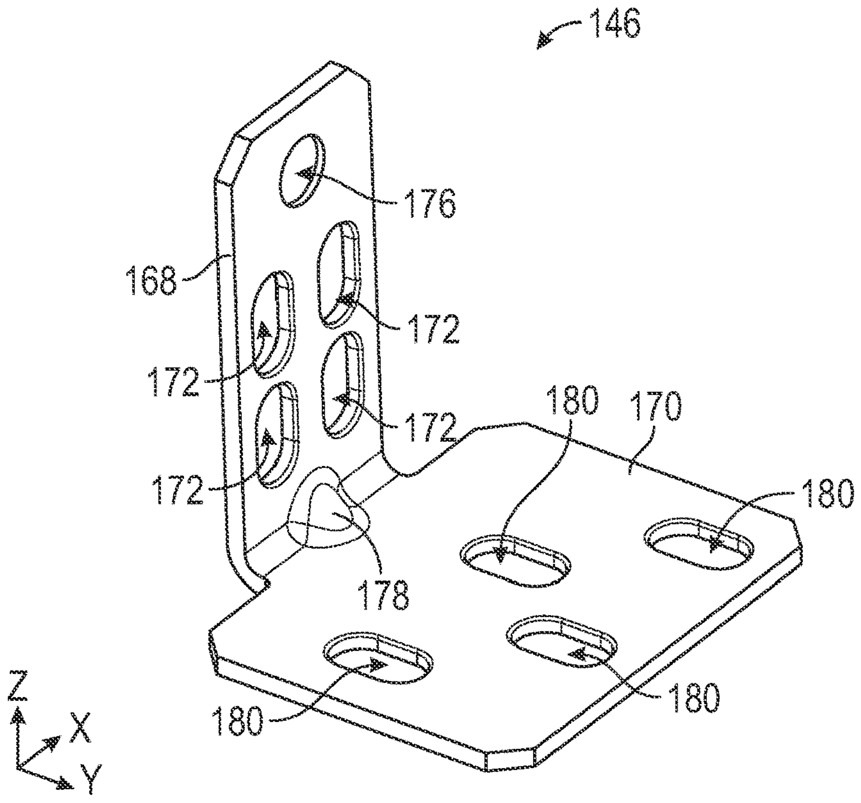
FIG. 4 is a perspective view of a mounting bracket of the apparatus of FIG. 1.
Figure 5:
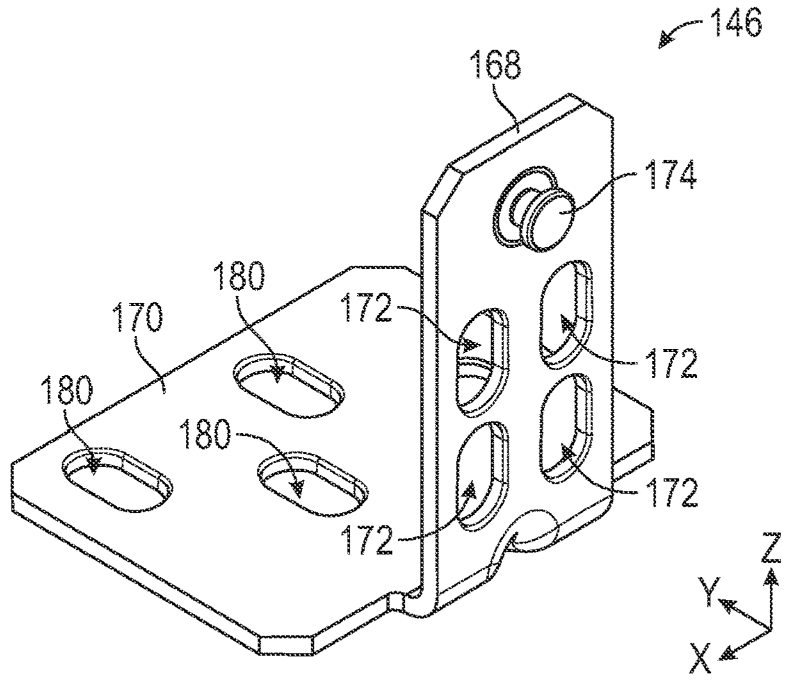
FIG. 5 is another perspective view of the mounting bracket.

With reference now to FIGS. 4 and 5, perspective views of the first mounting bracket 146 are provided. As shown, the first mounting bracket 146 includes a vertically-oriented plate 168 and a horizontally-oriented plate 170. The first mounting bracket is an L-shaped bracket in this example embodiment. Particularly, like the first mounting arm 148, the first mounting bracket 146 has an L-shaped cross section as viewed along the lateral direction X (when assembled).

The vertically-oriented plate 168 extends in a plane orthogonal to the longitudinal direction Y (when the first mounting bracket 146 is assembled). The vertically-oriented plate 168 defines one or more oblong holes 172 through which respective horizontally-oriented fasteners 150 extend through and connect to the first mounting arm 148, or rather, to respective threaded standoffs 164 of the vertically-oriented flange 160 (FIGS. 2 and 3). The oblong holes 172 each have a long axis extending along the vertical direction Z. That is, each one of the oblong holes 172 has a length extending along the vertical direction Z and a width extending along the lateral direction X. Each oblong hole has a greater length than width. Notably, the oblong holes 172 of the vertically-oriented plate 168 accommodate respective horizontally-oriented fasteners 150 that secure the first mounting arm 148 to the first mounting bracket 146. Specifically, the oblong holes 172 of the vertically-oriented plate 168 accommodate assembly tolerances and alignment by providing vertical flexibility to the mounting of the horizontally-oriented fasteners 150. In this way, the condenser 124 can be oriented and positioned at a height that enables the VC 122 to be arranged on the TIM 118 in a neutral position. Although four (4) oblong holes 172 are shown defined by the vertically-oriented plate 168, it will be appreciated that more or less than four (4) oblong holes can be defined by the vertically-oriented plate 168, such as two (2) oblong holes that align with the standoffs 164 of the vertically-oriented flange 160 (FIGS. 2 and 3).

Moreover, the vertically-oriented plate 168 includes a guide pin 174 secured within an opening 176 defined by the vertically-oriented plate 168. As shown in FIG. 6, the guide pin 174 is slidably received by the slot 166 of the first mounting arm 148. Accordingly, the first mounting arm 148 slidably receives the first mounting bracket 146.

Figure 7:
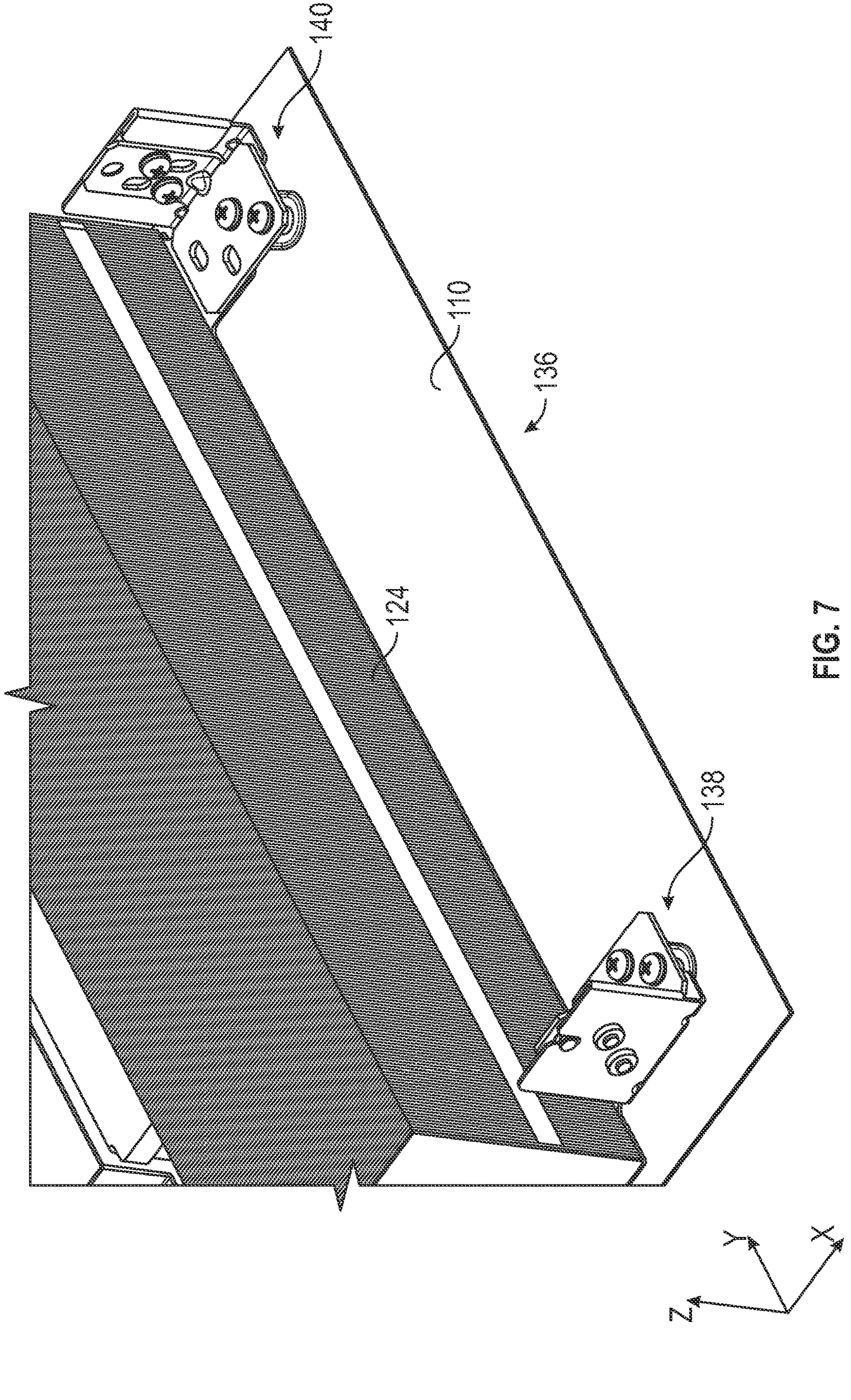
FIG. 7 is a perspective view of assembled side mounts of a side mounting assembly of the apparatus.

As further shown in FIGS. 4 and 5, the horizontally-oriented plate 170 extends in a plane orthogonal to the vertical direction Z (when the first mounting bracket 146 is assembled). A stiffening gusset 178 is positioned at the joint between the vertically-oriented plate 168 and the horizontally-oriented plate 170, e.g., to reduce the bending moment on the first mounting bracket 146. Also, the horizontally-oriented plate 170 defines one or more oblong holes 180 though which respective vertically-oriented fasteners 152 (FIG. 2) extend through to secure the first mounting bracket 146 to the base 110. Specifically, as shown in FIGS. 2 and 3, the base 110 has one or more base threaded standoffs 182 that receive respective vertically-oriented fasteners 152 that secure the first mounting bracket 146 to the base 110. FIGS. 6 and 7 show the vertically-oriented fasteners 152 extending through the oblong holes 180 of the horizontally-oriented plate 170 of the first mounting bracket 146 and into the base threaded standoffs 182 so as to secure the first mounting bracket 146 to the base 110, and ultimately, to couple the first mounting arm 148 of the condenser 124 to the base 110. In some embodiments, the one or more oblong holes 180 of the horizontally-oriented plate 170 include an adjacent pair of oblong holes that are offset from one another along the lateral direction X and the longitudinal direction Y. In this regard, the oblong holes 180 are diagonally spaced from one another. Such an arrangement can enhance access for assembling the vertically-oriented fasteners 152 and can advantageously secure the first mounting bracket 146 to the base 110 with greater holding strength.

The vertically-oriented fasteners 152 do not extend through the horizontally-oriented flange 162 of the first mounting arm 148 due to its L-shaped configuration (see FIG. 3). Specifically, the horizontally-oriented flange 162 defines a cutout 184 that allows the vertically-oriented fasteners 152 to extend through their respective oblong holes 180 in the horizontally-oriented plate 170 and into their respective base threaded standoffs 182 without contacting, passing through, or otherwise engaging the horizontally-oriented flange 162 of the first mounting arm 148. In this regard, the first mounting arm 148, or more broadly the condenser 124, is not directly coupled with the base 110 via any vertically-oriented fastener, including the vertically-oriented fasteners 152. Accordingly, when the vertically-oriented fasteners 152 are torqued during assembly, the height and orientation of the condenser 124 is not affected, and consequently, the VC 122 can remain in a neutral positon with respect to the TIM 118, e.g., as shown in FIG. 1. Although four (4) oblong holes 180 are shown defined by the horizontally-oriented plate 170, it will be appreciated that more or less than four (4) oblong holes can be defined by the horizontally-oriented plate 170, such as two (2) oblong holes that align with the base threaded standoffs 182.

Referring again to FIGS. 2 and 3, the second side mount 140 can include the same features of the first side mount 138 described above. Accordingly, for the sake brevity, the second side mount 140 will not be described in detail. However, generally, the second side mount 140 is positioned at the second end 144 of the condenser 124 and includes a second mounting bracket 186, a second mounting arm 188 of the condenser 124, and a second plurality of fasteners, including at least one horizontally-oriented fastener 190 and at least one vertically-oriented fastener 192. The second mounting bracket 186 couples the condenser 124 to the base 110. Specifically, the second mounting arm 188, which extends outward to a side of the condenser 124 (the same side to which the first mounting arm 148 extends), is secured to the second mounting bracket 186. The second mounting bracket 186 is in turn secured to the base 110. More specifically still, the second mounting arm 188 extends from the condenser base 158 and couples to the second mounting bracket 186, which is in turn coupled with the base 110 on the remote side 156 of the condenser 124. The second mounting arm 188 can be coupled with the condenser base 158 or can be integrally formed therewith. In addition, the second mounting bracket 186 can define one or more second oblong holes 194 to accommodate respective second horizontally-oriented fasteners 190 that secure the second mounting arm 188 of the condenser 124 to the second mounting bracket 186 in such a way that the condenser 124 is oriented and positioned at the height so that the VC 122 is arranged on the TIM 118 in the neutral position, e.g., as shown in FIG. 1.

FIG. 7 shows the first side mount 138 and the second side mount 140 of the side mounting assembly 136 fully assembled. Assembly of such first and second side mounts 138, 140, or more broadly the apparatus 100, will be described below with reference to FIGS. 8, 9 and 10, but assembly can be summarized as follows with reference to FIGS. 1 through 7. First, with the condenser 124 not yet coupled via the side mounting assembly 136, a force F1 is applied on the VC 122 so that the VC 122 is pressed against TIM 118 disposed on IC 116. The VC 122 is coupled with, and spaced from, the condenser 124. Second, with the force F1 still applied on the VC 122, the VC 122 can be secured so that the VC 122 is in a neutral position with respect to the TIM 118. The VC fasteners 128 can secure the VC 122 in place relative to TIM 118. The VC springs 129 can push the VC 122 vertically downward onto the TIM 118. Third, the condenser 124 is coupled with the base 110 via one or more side mounts, which includes, for each side mount: arranging a mounting bracket relative to a mounting arm of the condenser 124; securing the mounting bracket to the base 110 (e.g., via one or more vertically-oriented fasteners) with the mounting bracket arranged relative to the mounting arm; and securing the mounting bracket to the mounting arm via one or more horizontally-oriented fasteners. The horizontally-oriented fasteners can extend through respective oblong holes defined by the mounting bracket and can be secured to the mounting arm. An example assembly technique is provided below in more detail.

Figure 8:
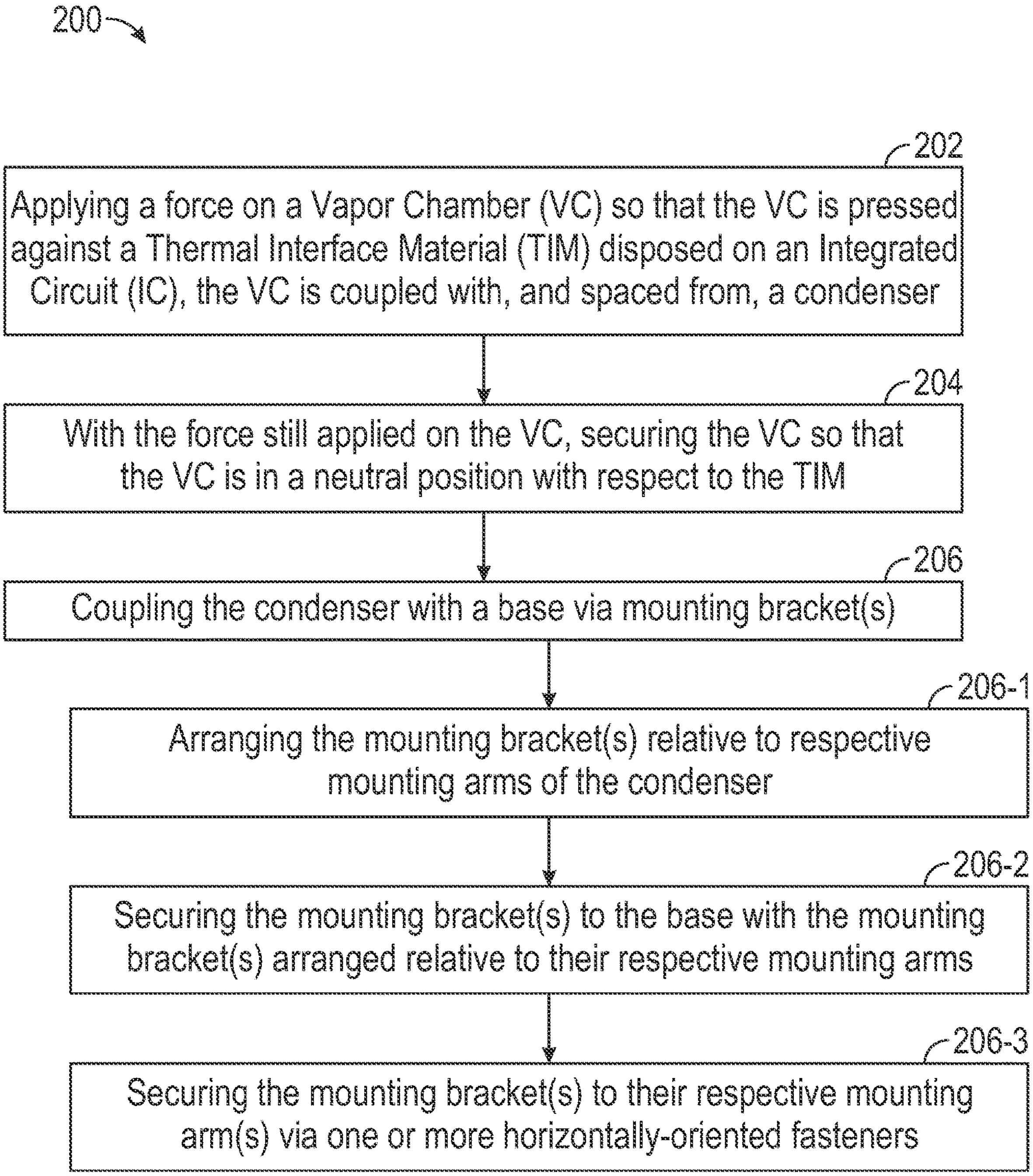
FIG. 8 is a flow diagram for a method of assembling an apparatus according to example embodiments of the present disclosure.
Figure 9:
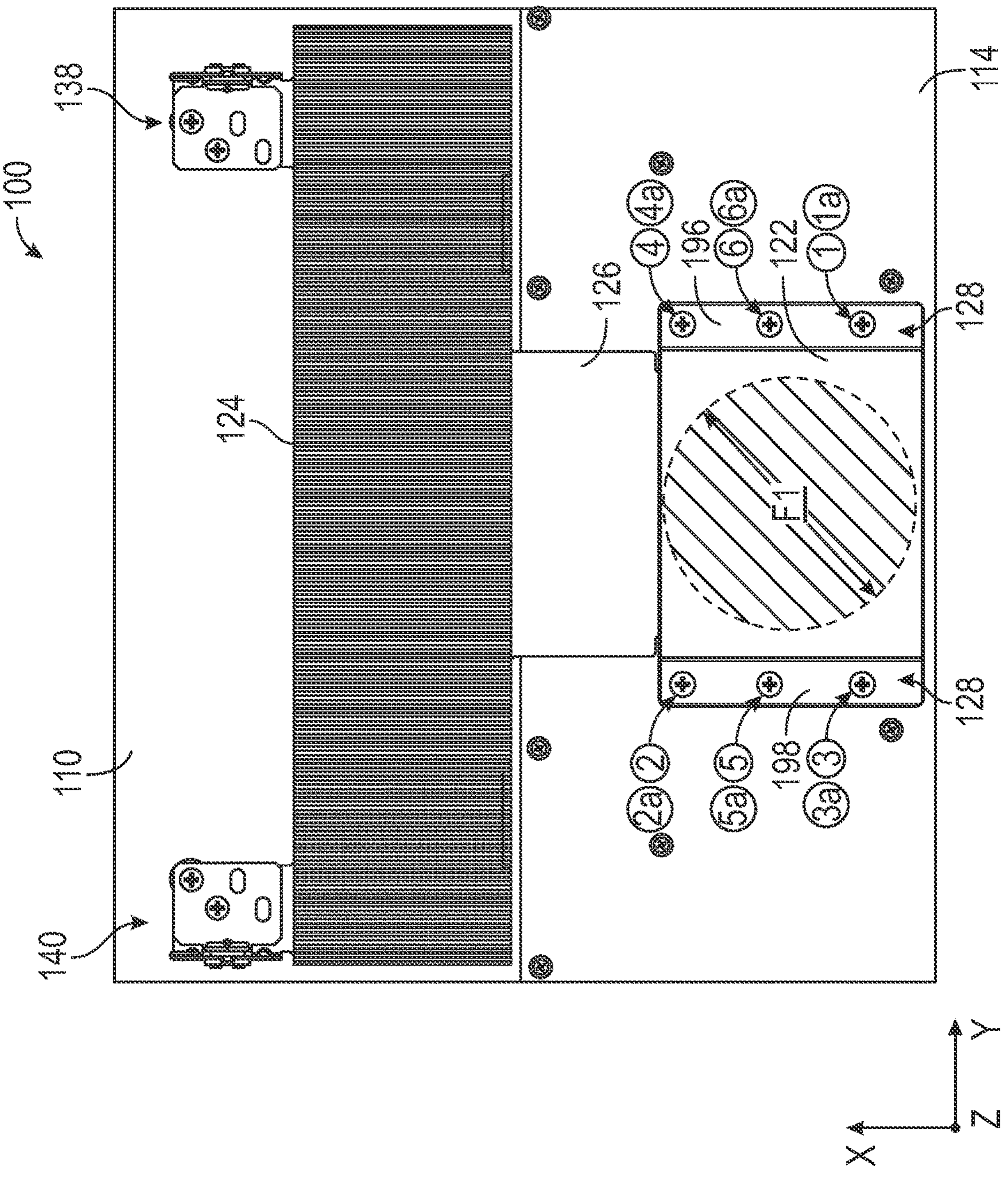
FIG. 9 is a top plan view of the apparatus of FIG. 1, and depicts an example sequence for assembling a vapor chamber of the apparatus.
Figure 10:
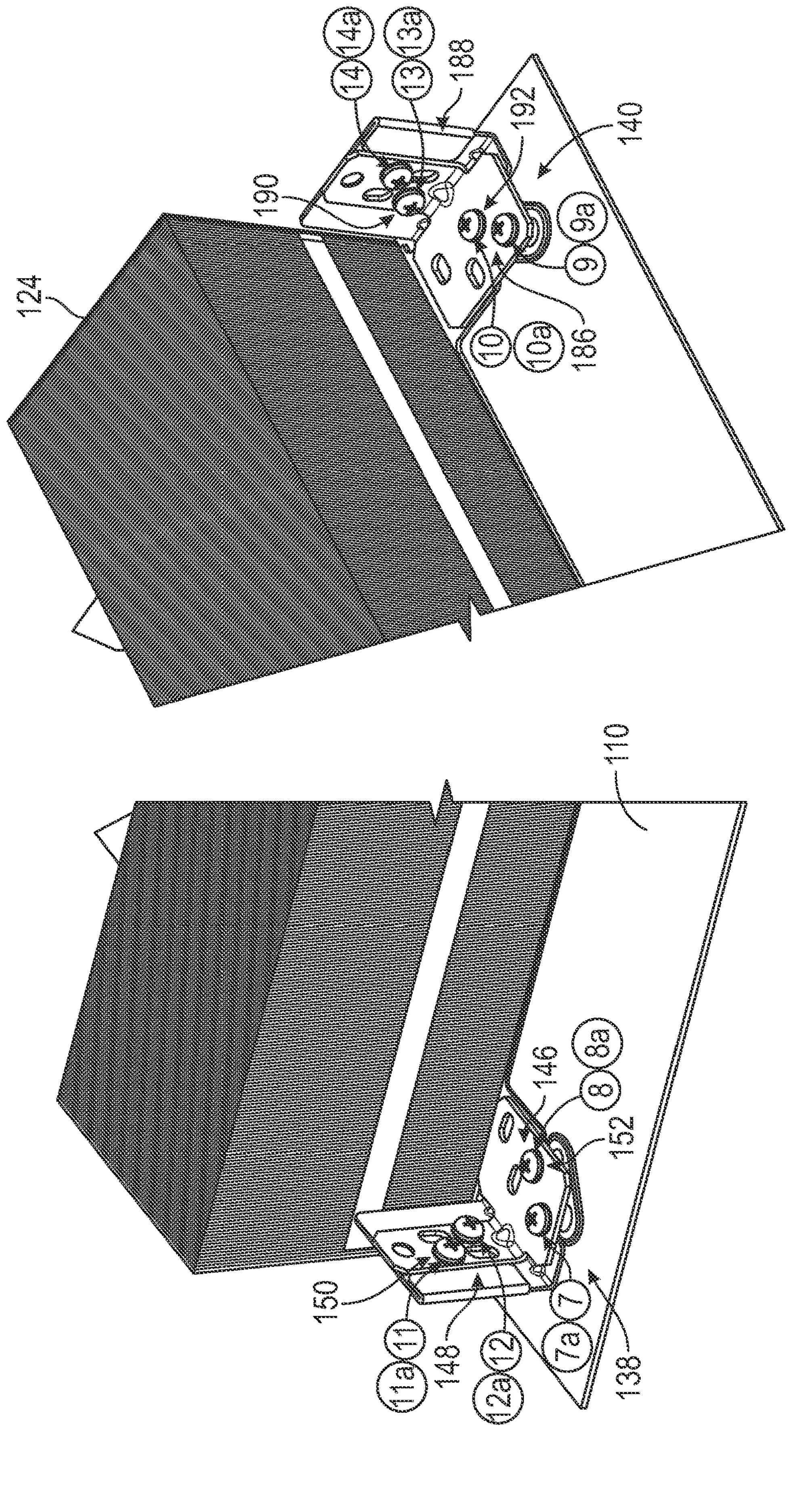
FIG. 10 is a broken perspective view of the apparatus of FIG. 1, and depicts an example sequence for assembling first and second side mounts of the side mounting assembly.

FIG. 8 is a flow diagram for a method 200 of assembling an apparatus according to example embodiments of the present disclosure. For instance, the method 200 can be used to assemble the apparatus 100 disclosed herein. Accordingly, for context, general reference is made to FIGS. 1 through 7 in addition to FIG. 8. Also, reference will be made to FIGS. 9 and 10. FIG. 9 is a top plan view of the apparatus 100 of FIG. 1 and depicts an example sequence for securing the VC 122 in place. FIG. 10 is a broken perspective view of the apparatus 100 and depicts an example sequence for securing the condenser 124 with the base 110 via the first and second side mounts 138, 140.

At 202, the method 200 can include applying a force on a vapor chamber (VC) so that the VC is pressed against a thermal interface material (TIM) disposed on an integrated circuit (IC), the VC is coupled with, and spaced from, a condenser. For instance, with the heat sink 120 assembled so that the VC 122 is coupled with the condenser 124 via the heat pipe 126, the VC 122 can be placed on the PCB 114. A support can be placed under the condenser 124 to support the weight of the condenser 124. Then, as shown in FIGS. 1 and 9, a force F1 can be applied on the VC 122 so that the VC is pressed against the TIM 118 disposed on the IC 116. In some example implementations, the force F1 can be applied on the VC 122 by a plunger. The force F1 applied by the plunger can be in an area having a diameter of 3 to 4 inches (or 7.5 cm to 10.5 cm), for example. Other areas of applied force are contemplated. In some implementations, the plunger can apply a constant force on the VC 122 throughout assembly.

At 204, the method 200 can include, with the force still applied on the VC, securing the VC so that the VC is in a neutral position with respect to the TIM. For instance, with the force F1 still applied on the VC 122, the VC fasteners 128 can be tightened to secure the VC 122 in place with the VC 122 in a neutral position with respect to the TIM 118. As one example, the vertically-oriented VC fasteners 128 can be tightened (e.g., with a screwdriver) according to the sequence 1*a*, 2*a*, 3*a*, 4*a*, 5*a*, 6*a* and with a first predetermined torque, wherein the tightening of the screws alternates between tightening a first side flange 196 of the VC 122 and a second side flange 198 of the VC 122. Once each of the VC fasteners 128 are tightened, the VC fasteners 128 can be re-tightened or re-torqued (e.g., with a screwdriver) according to the sequence 1, 2, 3, 4, 5, 6 and with a second predetermined torque, which can be the same or different than the first predetermined torque.

At 206, the method 200 can include coupling the condenser with a base via one or more mounting brackets. The coupling of the condenser with the base via the mounting bracket(s) can include performing the operations at 206-1, 206-2, and 206-3. In some implementations, the force F1 applied on the VC 122 is still applied or retained during coupling of the condenser 124 with the base 110 via the mounting bracket(s).

At 206-1, coupling the condenser with the base via the mounting bracket(s) can include arranging the mounting brackets relative to respective mounting arms of the condenser. For instance, the first mounting bracket 146 can be arranged relative to the first mounting arm 148 and the second mounting bracket 186 can be arranged relative to the second mounting arm 188. In some implementations, arranging a mounting bracket relative to a mounting arm of the condenser can include sliding a guide pin of the mounting bracket into a slot defined by the mounting arm so that one or more oblong holes defined by the mounting bracket are in communication with respective standoffs of the mounting arm. For example, with reference to FIG. 6, the guide pin 174 of the first mounting bracket 146 can be slid into the slot 166 defined by the first mounting arm 148. In this way, the guide pin 174 guides the first mounting bracket 146 into position so that the oblong holes 172 (FIGS. 4 and 5) are in communication with respective standoffs 164 of the first mounting arm 148. The alignment of the oblong holes 172 with respective standoffs 164 allows for the horizontally-oriented fasteners 150 to secure the first mounting bracket 146 with the first mounting arm 148. Further, when the guide pin 174 of the first mounting bracket 146 is slidably received by the slot 166 of the first mounting arm 148, the vertically-oriented plate 168 of the first mounting bracket 146 engages the vertically-oriented flange 160 of the first mounting arm 148 and the horizontally-oriented plate 170 of the first mounting bracket 146 is seated, at least in part, on the horizontally-oriented flange 162 of the first mounting arm 148. The second mounting bracket 186 can be arranged relative to the second mounting arm 188 in a similar fashion.

At 206-2, coupling the condenser with the base via the mounting bracket(s) can include securing the mounting bracket(s) to the base with the mounting bracket(s) arranged relative to their respective mounting arms. For instance, with the first mounting bracket 146 arranged relative to the first mounting arm 148, the first mounting bracket 146 can be secured to the base 110. Particularly, the vertically-oriented fasteners 152 can be inserted through respective oblong holes 180 in the horizontally-oriented plate 170 of the first mounting bracket 146 and into respective base threaded standoffs 182. The vertically-oriented fasteners 152 do not pass through the horizontally-oriented flange 162 of the first mounting arm 148. Similarly, with the second mounting bracket 186 arranged relative to the second mounting arm 188, the second mounting bracket 186 can be secured to the base 110. Specifically, the vertically-oriented fasteners 192 can be inserted through respective oblong holes in the horizontally-oriented plate of the second mounting bracket 186 and into respective base threaded standoffs of the base 110. As one example, with reference to FIG. 10, the vertically-oriented fasteners 152 and the vertically-oriented fasteners 192 can be tightened (e.g., with a screwdriver) according to the sequence 7*a*, 8*a*, 9*a*, 10*a* and with a third predetermined torque. Other tightening sequences are possible. In some implementations, for example, the vertically-oriented fasteners 192 can be tightened prior to the vertically-oriented fasteners 152 in the sequence.

At 206-3, coupling the condenser with the base via the mounting bracket(s) can include securing the mounting bracket(s) to their respective mounting arms via one or more horizontally-oriented fasteners. For instance, the first mounting bracket 146 can be secured to the first mounting arm 148 via the horizontally-oriented fasteners 150 and the second mounting bracket 186 can be secured to the second mounting arm 188 via the horizontally-oriented fasteners 190. In some implementations, for each side mount, the one or more horizontally-oriented fasteners extend through respective ones of one or more oblong holes defined by the mounting bracket and are received by standoffs of the mounting arm. Particularly, the horizontally-oriented fasteners 150 can be inserted through respective oblong holes 172 in the vertically-oriented plate 168 of the first mounting bracket 146 and into respective standoffs 164 of the first mounting arm 148. With the force F1 applied on the VC 122 so that the VC 122 is arranged on the TIM 118 in a neutral position, the horizontally-oriented fasteners 150 can secure the first mounting bracket 146 to the first mounting arm 148 to "lock in" the orientation and height of the condenser 124. The oblong holes 172 accommodate assembly tolerances and alignment so that the condenser 124 can be oriented and positioned at the height that enables the VC 122 to be arranged on the TIM 118 in the neutral position, even after the force F1 is removed from the VC 122.

Similarly, the horizontally-oriented fasteners 190 can be inserted through respective oblong holes in the vertically-oriented plate of the second mounting bracket 186 and into respective standoffs of the second mounting arm 188. With the force F1 applied on the VC 122 so that the VC 122 is arranged on the TIM 118 in a neutral position, the horizontally-oriented fasteners 190 can secure the second mounting bracket 186 to the second mounting arm 188 to "lock in" the orientation and height of the condenser 124. The oblong holes 194 accommodate assembly tolerances and alignment so that the condenser 124 can be oriented and positioned at the height that enables the VC 122 to be arranged on the TIM 118 in the neutral position, even after the force F1 is removed from the VC 122.

As one example, with reference to FIG. 10, the horizontally-oriented fasteners 150, 190 can be tightened (e.g., with a screwdriver) according to the sequence 11*a*, 12*a*, 13*a*, 14*a* and with a fourth predetermined torque. Other tightening sequences are possible. In some implementations, for example, the horizontally-oriented fasteners 190 can be tightened prior to the horizontally-oriented fasteners 150 in the sequence. Further, the threaded standoffs 164 of the first mounting arm 148 and the threaded standoffs of the second mounting arm 188 can be spaced from a side (e.g., the remote side) of the condenser 124 to allow space for a machine or user to tighten the horizontally-oriented fasteners 150, 190 to secure the first and second mounting brackets 146, 186 to their respective first and second mounting arms 148, 188. As one example, the threaded standoffs of the first and second mounting arms 148, 188 can be spaced from the remote side of the condenser 124 a distance that is at least one third (⅓) of a length of the vertically-oriented flanges of their respective first and second mounting arms 148, 188.

Once each of the vertically-oriented fasteners 152, 192 and horizontally-oriented fasteners 150, 190 are tightened, the vertically-oriented fasteners 152, 192 and horizontally-oriented fasteners 150, 190 can be re-tightened or re-torqued (e.g., with a screwdriver) according to the sequence 7, 8, 9, 10, 11, 12, 13, 14 and with a fifth predetermined torque, which can be the same or different than the third and/or fourth predetermined torque.

As the first and second mounting arms 148, 188 of the condenser 124 are secured to the first and second mounting brackets 146, 186 with the horizontally-oriented fasteners 150, 190, the height and orientation of the condenser 124 is unaffected or affected with negligible effect when the horizontally-oriented fasteners 150, 190 are tightened. In this regard, the neutral position of the VC 122 on the TIM 118 is not affected (or only to a negligible extent), which ultimately provides improved thermal performance to the apparatus 100 and prevents thermal run away, among other benefits. As noted, the oblong holes 172, 194 account for mechanical tolerance accumulation in assembly of the apparatus 100 by providing vertical flexibility so that the condenser 124 can be mounted at the desired orientation and height so that the VC 122 can be maintained on the TIM 118 in the neutral position. Moreover, the first and second mounting brackets 146, 186 can couple the condenser 124 with the base 110 so that the condenser base 158 is unloaded, or rather, so that no vertically-upward force acts directly on the condenser base 158, e.g., as shown in FIG. 1. In this regard, the condenser 124 height and orientation can be controlled and maintained by the first and second side mounts 138, 140 of the side mounting assembly 136.

Further, after the first and second mounting arms 148, 188 of the condenser 124 are secured to the first and second mounting brackets 146, 186, the force F1 can be removed from the VC 122. For instance, a plunger can be moved vertically upward away from the VC 122. Once the force F1 is removed, the side mounting assembly 136 enables the VC 122 to remain on the TIM 118 in the neutral position.

In some implementations, a pressure measurement tool can be used during assembly of an apparatus and/or in other instances, such as during field testing. The pressure measurement tool can include a membrane with a pressure sensor array to measure pressure on a surface. The pressure sensor membrane can be placed on an interface plane where the VC would normally mount on the TIM or on an interface plane where the TIM would normally be applied to the IC. The measurement tool can display a color-coded map of a pressure profile on such interface planes. The measurement tool can detect whether a surface has even pressure distribution or high gradient pressure differentials.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. An apparatus, comprising:

a base;

an integrated circuit (IC);

a thermal interface material (TIM) disposed on the IC;

a heat sink having a vapor chamber (VC) and a condenser in a fixed spatial relationship with, and spaced from, the VC, the condenser has a mounting arm extending from a side of the condenser; and a mounting bracket coupling the condenser with the base, the mounting bracket defines one or more oblong holes accommodating respective ones of one or more horizontally-oriented fasteners that secure the mounting arm to the mounting bracket in such a way that the condenser is oriented and positioned at a height so that the VC is arranged on the TIM in a neutral position.

2. The apparatus of claim 1, wherein the mounting bracket is an L-shaped bracket that includes a vertically-oriented plate and a horizontally-oriented plate, and wherein the vertically-oriented plate defines the one or more oblong holes through which respective ones of the one or more horizontally-oriented fasteners extend through and connect to the mounting arm.

3. The apparatus of claim 2, wherein the mounting arm has a vertically-oriented flange having one or more threaded standoffs that receive respective ones of the one or more horizontally-oriented fasteners.

4. The apparatus of claim 3, wherein each one of the one or more threaded standoffs are spaced from a remote side of the condenser a distance that is at least one third a lateral length of the vertically-oriented flange of the mounting arm.

5. The apparatus of claim 2, wherein the horizontally-oriented plate of the mounting bracket defines one or more oblong holes through which one or more vertically-oriented fasteners extend through to secure the mounting bracket to the base.

6. The apparatus of claim 5, wherein the apparatus defines a lateral direction and a longitudinal direction, and wherein the one or more oblong holes defined by the horizontally-oriented plate of the mounting bracket are offset from one another along the lateral direction and the longitudinal direction.

7. The apparatus of claim 1, wherein the base has one or more base threaded standoffs that receive respective ones of one or more vertically-oriented fasteners that secure the mounting bracket to the base.

8. The apparatus of claim 1, wherein the mounting arm is not directly coupled with the base via a vertically-oriented fastener.

9. The apparatus of claim 8, wherein a vertically-oriented plate of the mounting bracket engages a vertically-oriented flange of the mounting arm and a horizontally-oriented plate of the mounting bracket is seated, at least in part, on a horizontally-oriented flange of the mounting arm.

10. The apparatus of claim 1, wherein the mounting arm defines a slot having a long axis extending along a vertical direction and the mounting bracket includes a guide pin, and wherein the guide pin is slidably received by the slot.

11. The apparatus of claim 1, further comprising:
a heat pipe extending between and coupling the condenser with the VC.

12. The apparatus of claim 1, wherein the mounting bracket couples the condenser with the base so that a condenser base of the condenser is unloaded.

13. The apparatus of claim 1, wherein the condenser has a proximal side and a remote side that is further away from the IC than the proximal side, and wherein the mounting arm extends from a condenser base and couples the condenser with the base on the remote side of the condenser.

14. The apparatus of claim 1, wherein the mounting arm and the mounting bracket are components of a first side mount assembly, and wherein the condenser extends along a lateral direction between a first end and a second end, the first side mount assembly being positioned at the first end of the condenser, and wherein the apparatus further comprises:
a second side mount assembly positioned at a second end, the second side mount assembly comprising:
a different mounting bracket coupling the condenser with the base, the different mounting bracket defines one or more different oblong holes to accommodate respective ones of one or more different horizontally-oriented fasteners that secure a different mounting arm of the condenser to the different mounting bracket in such a way that the condenser is oriented and positioned at the height so that the VC is arranged on the TIM in a neutral position where the VC is not tilted.

15. A method, comprising:
applying a force on a vapor chamber (VC) so that the VC is pressed against a thermal interface material (TIM) disposed on an integrated circuit (IC), the VC is coupled with, and spaced from, a condenser;
with the force still applied on the VC, securing the VC so that the VC is in a neutral position with respect to the TIM; and
coupling the condenser with a base via a mounting bracket, which comprises:
arranging the mounting bracket relative to a mounting arm of the condenser;
securing the mounting bracket to the base with the mounting bracket arranged relative to the mounting arm; and
securing the mounting bracket to the mounting arm via one or more horizontally-oriented fasteners.

16. The method of claim 15, wherein the force on the VC is applied during coupling of the condenser with the base via the mounting bracket.

17. The method of claim 15, wherein the one or more horizontally-oriented fasteners extend through respective ones of one or more oblong holes defined by the mounting bracket and are received by standoffs of the mounting arm.

18. The method of claim 15, wherein arranging the mounting bracket relative to the mounting arm of the condenser comprises sliding a guide pin of the mounting bracket into a slot defined by the mounting arm so that one or more oblong holes defined by the mounting bracket are in communication with respective standoffs of the mounting arm.

19. The method of claim 15, wherein securing the mounting bracket to the base with the mounting bracket arranged relative to the mounting arm comprises securing the mounting bracket to the base via one or more vertically-oriented fasteners that extend through respective ones of one or more oblong holes defined by a horizontally-oriented plate of the mounting bracket and are received by respective base standoffs of the base.

20. An apparatus, comprising:
a base;
an integrated circuit (IC);
a thermal interface material (TIM) disposed on the IC;
a heat sink having a vapor chamber (VC) and a condenser in a fixed spatial relationship with, and spaced from, the VC, the condenser has a mounting arm extending from a side of the condenser; and
a mounting bracket coupling the condenser with the base, the mounting bracket has a horizontally-oriented plate and a vertically-oriented plate that each define one or more oblong holes, wherein the horizontally-oriented plate is secured to the base via one or more vertically-oriented fasteners that extend through respective ones of the one or more oblong holes of the horizontally-oriented plate, and wherein the vertically-oriented plate is secured to the mounting arm via one or more horizontally-oriented fasteners that extend through respective ones of the one or more oblong holes of the vertically-oriented plate so that the condenser is oriented and positioned at a height that holds the VC on the TIM in a neutral position.

* * * * *